US009882535B2

(12) United States Patent
Jang et al.

(10) Patent No.: US 9,882,535 B2
(45) Date of Patent: Jan. 30, 2018

(54) DOHERTY-CHIREIX COMBINED AMPLIFIER

(71) Applicant: Infineon Technologies AG, Neubiberg (DE)

(72) Inventors: Haedong Jang, San Jose, CA (US); Richard Wilson, Morgan Hill, CA (US); Timothy Canning, Morgan Hill, CA (US); David Seebacher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/195,575

(22) Filed: Jun. 28, 2016

(65) Prior Publication Data
US 2017/0373645 A1 Dec. 28, 2017

(51) Int. Cl.
*H03F 3/68* (2006.01)
*H03F 1/02* (2006.01)
*H03F 1/56* (2006.01)
*H03F 3/21* (2006.01)
*H03F 3/193* (2006.01)
*H03F 3/60* (2006.01)

(52) U.S. Cl.
CPC ............ *H03F 1/0288* (2013.01); *H03F 1/56* (2013.01); *H03F 3/193* (2013.01); *H03F 3/21* (2013.01); *H03F 3/604* (2013.01); *H03F 2200/255* (2013.01); *H03F 2200/423* (2013.01); *H03F 2200/451* (2013.01)

(58) Field of Classification Search
USPC ................... 330/124 R, 295, 84, 286, 53–54
See application file for complete search history.

(56) References Cited

U.S. PATENT DOCUMENTS

| 7,221,219 | B2 * | 5/2007 | Hellberg | ............... H03F 1/0205 330/124 R |
| 8,384,475 | B2 * | 2/2013 | Gustavsson | ........... H03F 1/0288 330/124 R |
| 2007/0080747 | A1 | 4/2007 | Klingberg et al. | |

OTHER PUBLICATIONS

Andersson, C. M. et al., "A 1-3-GHz Digitally Controlled Dual-RF Input Power-Amplifier Design Based on a Doherty-Outphasing Continuum Analysis", IEEE Transactions on Microwave Theory and Techniques, vol. 61, No. 10, Oct. 2013, pp. 3743-3752.

(Continued)

*Primary Examiner* — Hieu Nguyen
(74) *Attorney, Agent, or Firm* — Murphy, Bilak & Homiller, PLLC

(57) ABSTRACT

An amplifier that is configured to amplify an RF signal includes a power combiner circuit. The power combiner circuit includes a first branch connected between a first RF input port and a summing node and a second branch connected between a second RF input port and the summing node. Each of the first and second branches includes an impedance inverter. The Chireix combiner is configured to present a Chireix load modulated impedance response to the first and second RF input ports. The power combiner circuit further includes compensation elements being configured to at least partially compensate for a reactance of the Chireix combiner circuit in a Doherty amplifier mode in which a signal is applied to the first RF input port and the second RF input port is electrically open.

20 Claims, 13 Drawing Sheets

(56) References Cited

OTHER PUBLICATIONS

Barton, Taylor W. et al., "Four-Way Microstrip-Based Power Combining for Microwave Outphasing Power Amplifiers", IEEE Transactions on Circuits and Systems I: Regular Papers, vol. 61, Issue 10, May 30, 2014, pp. 1-12.
Barton, Taylor W. et al., "An RF-input Outphasing Power Amplifier with RF Signal Decomposition Network", Microwave Symposium Digest (MTT), 2014 IEEE MTT-S International, May 2015, pp. 1-4.
Chireix, H., "High Power Outphasing Modulation", Proceedings of the Institute of Radio Engineers, vol. 23, Issue 11, Nov. 1935, pp. 1370-1392.
Darraji, R. et al., "A Dual-Input Digitally Driven Doherty Amplifier Architecture for Performance Enhancement of Doherty Transmitters", IEEE Trans. Microw. Theory Techn., vol. 59, No. 5, May 2011, pp. 1284-1293.
Doherty, W H., "A New High Efficiency Power Amplifier for Modulated Waves", Proc. IRE, vol. 24, Sep. 1936., Sep. 1936, pp. 1163-1182.
Gerhard, Walter et al., "Novel Transmission Line Combiner for Highly Efficient Outphasing RF Power Amplifiers", Microwave Integrated Circuit Conference, 2007, EuMIC 2007, European, Munich, Germany, Oct. 2007, pp. 1433-1436.
Jang, Haedong et al., "Self-Outphasing Chireix Power Amplifier Using Device Input Impedance Variation", Microwave Symposium Digest (MTT), 2016 IEEE MTT-S International, May 2016, pp. 1-4.
Raab, Frederick H., "Efficiency of Outphasing RF Power-Amplifier Systems", IEEE Transactions on Communications, vol. 33, Issue 10, Oct. 1985, pp. 1094-1099.

\* cited by examiner

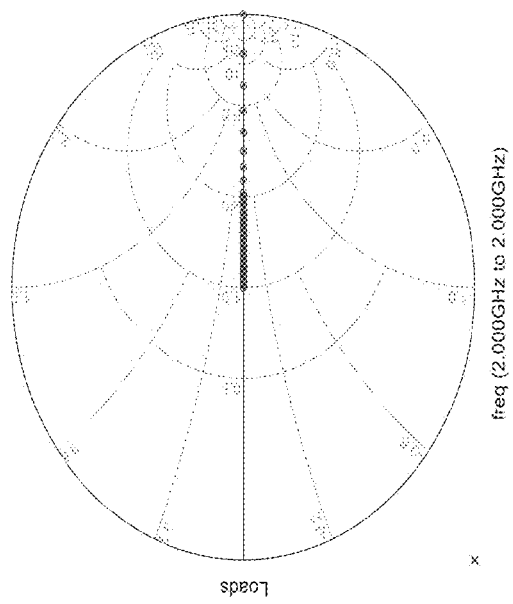
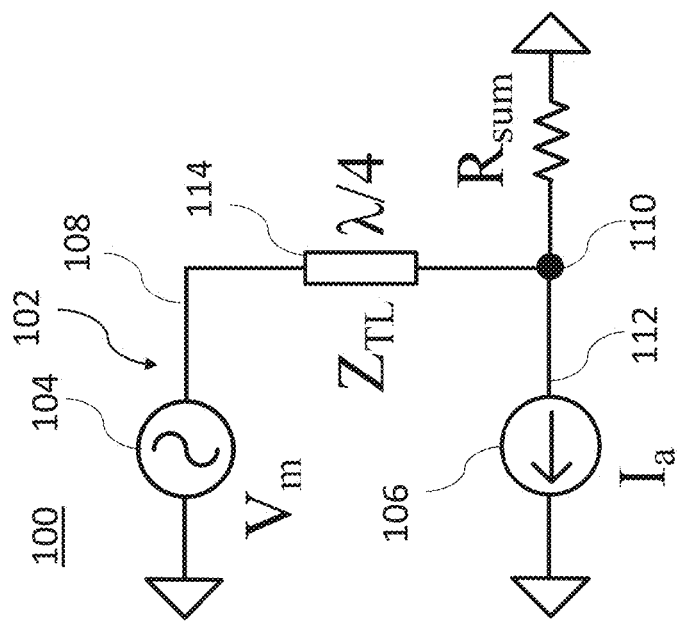
FIGURE 1

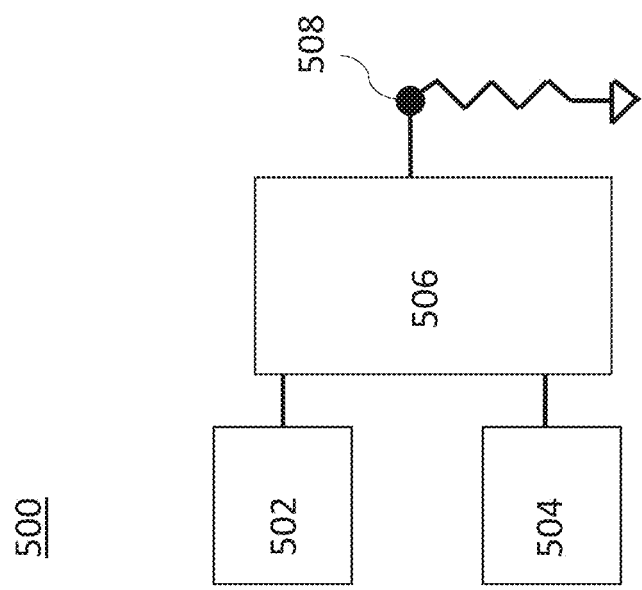

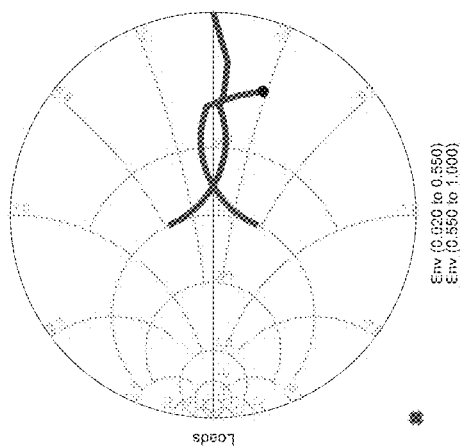
FIG. 6B
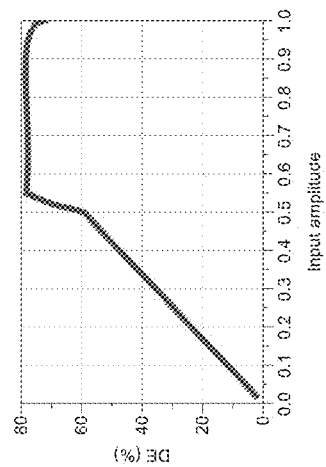
FIG. 6C
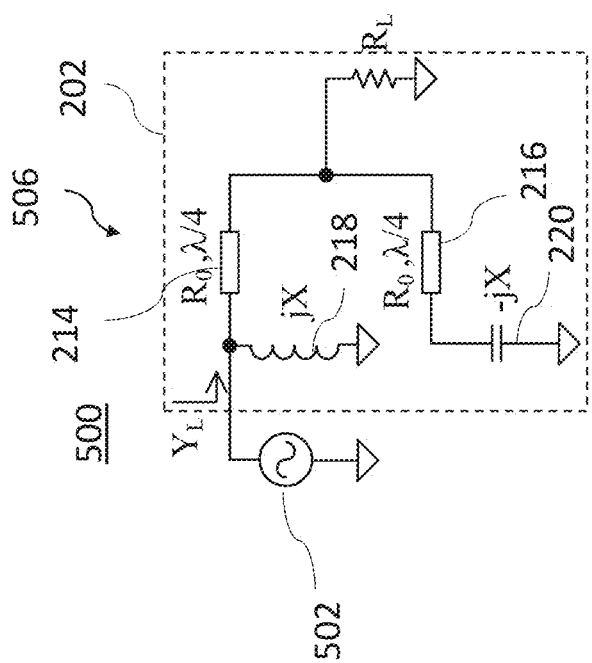
FIG. 6A
FIGURE 6

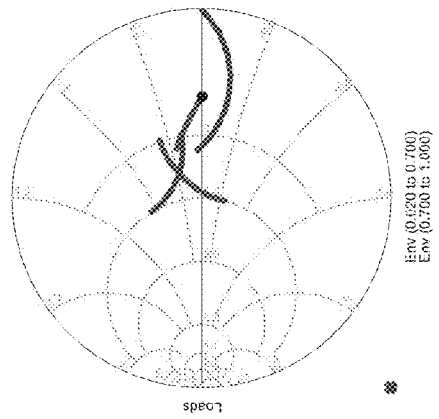
FIG. 8C
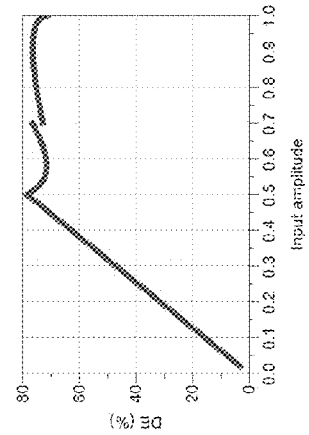
FIG. 8D
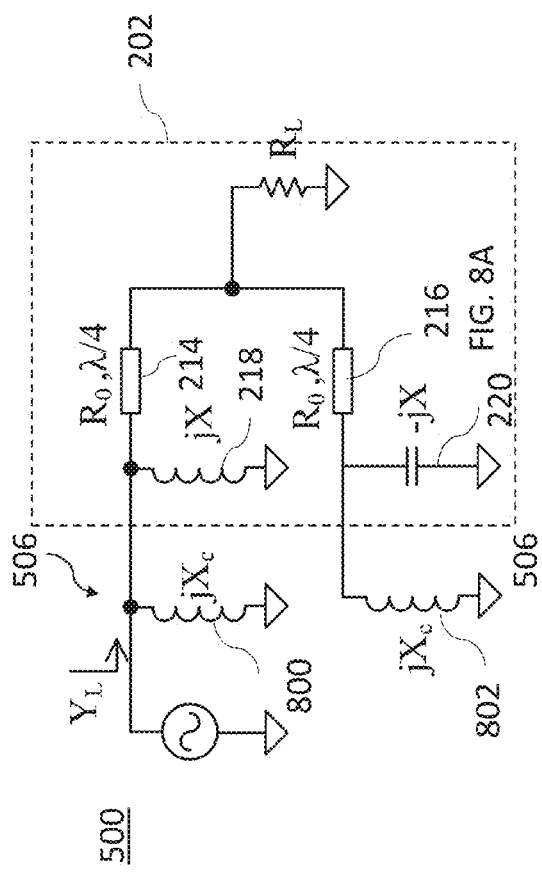
FIG. 8A
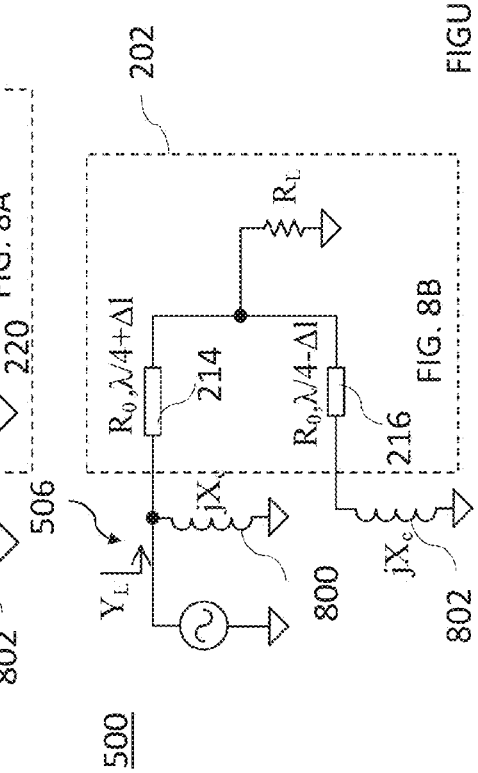
FIG. 8B
FIGURE 8

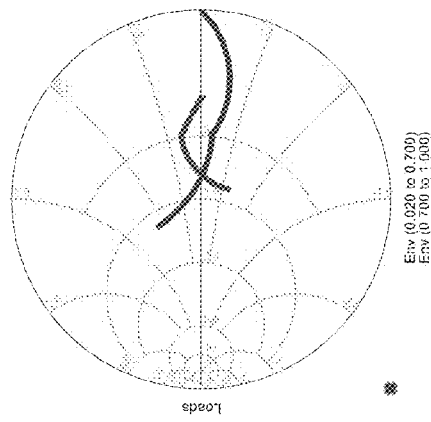
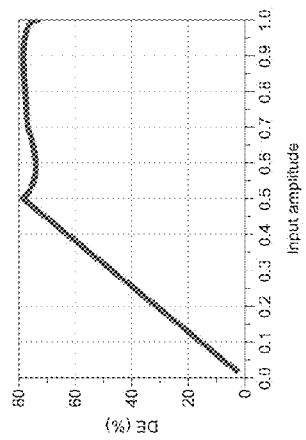
FIG. 10A FIG. 10B
FIGURE 10

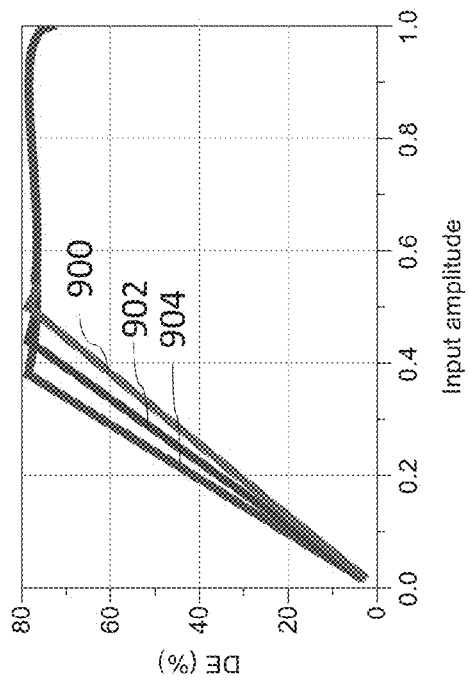
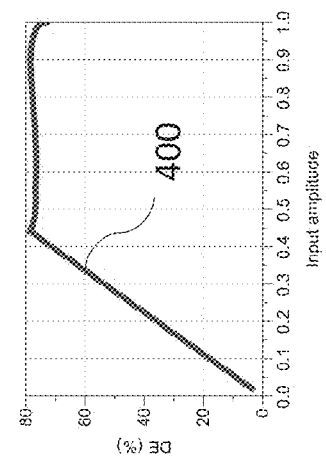
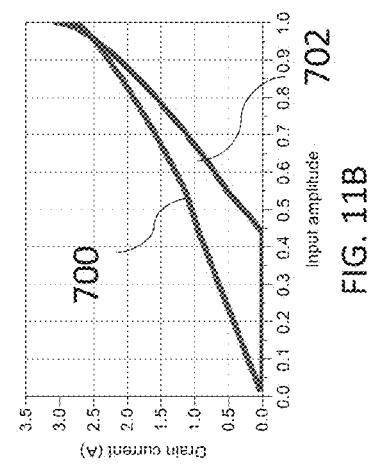
FIGURE 11

DOHERTY-CHIREIX COMBINED AMPLIFIER

FIELD OF TECHNOLOGY

The present application relates to RF (radio frequency) amplifier circuits, and in particular relates to efficient power back-off mode amplifier designs.

BACKGROUND

RF power amplifiers are used in a variety of applications such as base stations for wireless communication systems etc. The signals amplified by the RF power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 300 MHz or higher.

A device package for an RF power amplifier can include a transistor die (e.g., MOSFET (metal-oxide semiconductor field-effect transistor), LDMOS (laterally-diffused metal-oxide semiconductor), HEMT (high electron mobility transistor) along with an input and output impedance matching circuit incorporated therein. The input and output impedance matching circuits typically include LC networks that provide at least a portion of an impedance matching circuit that is configured to match the impedance of the transistor die to a fixed value. The device package may also include tuning circuits that are configured to filter out higher order harmonic components of the fundamental frequency to improve amplifier efficiency.

RF power architectures within the telecommunications field focus on achieving high DC-to-RF efficiency at significant power back-off from Psat (the average output power when the amplifier is driven deep into saturation). This is due to the high peak to average ratio (PAR) of the transmitted digital signals such as W-CDMA (wideband code division multiple access), LTE (long term evolution) and WiMAX (worldwide interoperability for microwave access).

One popular power amplifier architecture currently employed is the Doherty amplifier. The Doherty amplifier was first proposed by William H. Doherty, in 1936, and is described in "A new high efficiency power amplifier for modulated waves," Proc. IRE, vol. 24, pp. 1163-1182, September 1936, the content of which is incorporated by reference in its entirety. The Doherty amplifier employs a main amplifier which provides amplification at all power levels, and a peaking amplifier, which turns on at a high power level. Efficiency is enhanced through load modulation of the main amplifier from the peaking amplifier.

Another popular power amplifier architecture currently employed is the Chireix amplifier. The Chireix amplifier was first proposed by H. Chireix in 1935, and is described in "High power outphasing modulation," Proc. IRE, vol. 23, no. 11, pp. 1370-1392, November 1935, the content of which is incorporated by reference in its entirety. A Chireix amplifier utilizes an outphasing technique to amplify two phase-shifted constant envelope signals. The Chireix amplifier offers highly efficient and linear amplification without distortion.

Although the Doherty amplifier and the Chireix amplifier each offer high back-off efficiency for amplitude modulated signals, each design has limitations. In general, the Chireix amplifier provides higher efficiency than a Doherty amplifier in back-off ranges that are close to peak power, but less efficiency than a Doherty amplifier at lower power levels. Moreover, the Doherty amplifier typically has an efficiency droop (i.e., a region of lesser efficiency between two peaks) in the high power back-off region, whereas a Chireix amplifier offers more linear efficiency in the high power back-off region. Although some of these drawbacks of each amplifier can be addressed using additional circuitry and/or control techniques, known solutions substantially increase cost and circuit complexity and have limited success.

SUMMARY

An amplifier that is configured to amplify an RF signal is disclosed. According to an embodiment, the amplifier includes a power combiner circuit. The power combiner circuit includes a Chireix combiner having a first branch connected between a first RF input port and a summing node and a second branch connected between a second RF input port and the summing node. Each of the first and second branches include an impedance inverter. The Chireix combiner is configured to present a Chireix load modulated impedance response to the first and second RF input ports. The power combiner circuit further includes compensation elements that are configured to at least partially compensate for a reactance of the Chireix combiner circuit in a Doherty amplifier mode in which a signal is applied to the first RF input port and the second RF input port is electrically open.

A method of amplifying an RF signal is disclosed. The method includes providing an amplifier circuit having, a first amplifier, a second amplifier, and a power combiner circuit connected to the first and second amplifiers. The power combiner circuit includes a Chireix combiner that is configured to present a Chireix load modulated impedance response, and compensation elements. The method further includes operating the amplifier circuit in a Doherty amplifier mode for amplitude values of the RF signal that are at or below a predefined threshold. Operating the amplifier circuit in the Doherty amplifier mode includes generating a first amplified version of the RF signal using the first amplifier while the second amplifier is turned off, applying the first amplified version of the RF signal to a first input port of the power combiner circuit, and compensating for a reactance of the Chireix combiner using the compensation elements. The method further includes operating the amplifier circuit in a Chireix amplifier mode for amplitude values of the RF signal that are above the predefined threshold. Operating the amplifier circuit in the Chireix amplifier mode includes generating a first amplified version of the RF signal using the first amplifier, generating a second amplified version of the RF signal using the second amplifier, the second amplified version of the RF signal being out of phase with the first amplified version of the RF signal, and using the Chireix combiner to combine the first amplified version of the RF signal and the second amplified version of the RF signal and to modulate an impedance seen by the first and second amplifiers across varying power levels of the first and second amplified versions of the RF signal.

A method of amplifying an RF signal using an amplifier including first and second amplifier devices, and a power combiner circuit connected to the first and second amplifiers, the power combiner circuit including a Chireix combiner that is configured to present a Chireix load modulated impedance response, and compensation elements, is disclosed. According to an embodiment, the method includes operating the amplifier in a Doherty amplifier mode when an amplitude of the RF signal is at or below a predetermined threshold. Operating the amplifier circuit in the Doherty amplifier mode includes amplifying the RF signal using the first amplifier device while the second amplifier device is turned off, extracting a first amplified RF signal from the first amplifier device using the power combiner circuit, and compensating for an admittance of the Chireix combiner using the compensation elements so as to increase efficiency of the amplifier circuit. The method further includes operating the amplifier in a Chireix amplifier mode when an amplitude of the RF signal is above the predetermined threshold. Operating the amplifier circuit in the Chireix amplifier mode includes amplifying the RF signal using the first amplifier device and the second amplifier device, and extracting a first amplified RF signal from the first amplifier device and a second amplified RF signal from the second amplifier device using the power combiner circuit.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A and 1B, depicts a Doherty amplifier and a load modulated impedance response of the Doherty amplifier, according to an embodiment.

FIGS. 2A, 2B and 2C, depicts a Chireix amplifier and a load modulated impedance response of the Chireix amplifier, according to an embodiment.

FIG. 5 illustrates a schematic of a combined Doherty-Chireix amplifier, according to an embodiment.

FIG. 6, which includes FIGS. 6A, 6B and 6C, depicts an equivalent circuit of a Doherty-Chireix amplifier in low power mode, a load modulated impedance response of the Doherty-Chireix amplifier, and an efficiency plot of the Doherty-Chireix amplifier at power back-off, according to an embodiment.

FIGS. 7A, 7B and 7C and 7D, depicts drain currents for the first and second amplifiers of the Doherty-Chireix amplifier at power back-off and corresponding efficiency plots of the Doherty-Chireix amplifier at power back-off, according to an embodiment.

FIG. 8, which includes FIGS. 8A, 8B, 8C and 8D, depicts an equivalent circuit of a Doherty-Chireix amplifier with reactance compensation in low power mode, a load modulated impedance response of the Doherty-Chireix amplifier, and an efficiency plot of the Doherty-Chireix amplifier at power back-off, according to an embodiment.

FIG. 10, which includes FIGS. 10A and 10B, depicts a load modulated impedance response and an efficiency plot at power back-off for a Doherty-Chireix amplifier that is operated with asymmetric outphasing.

FIG. 11, which includes FIGS. 11A, 11B and 11C, depicts the impact of adjusting the transition point between Doherty and Chireix modes, an efficiency plot, and drain currents for the first and second amplifiers for a Doherty-Chireix with an optimized transition point and turn-on control for the second amplifier, according to an embodiment.

DETAILED DESCRIPTION

Figure 2:
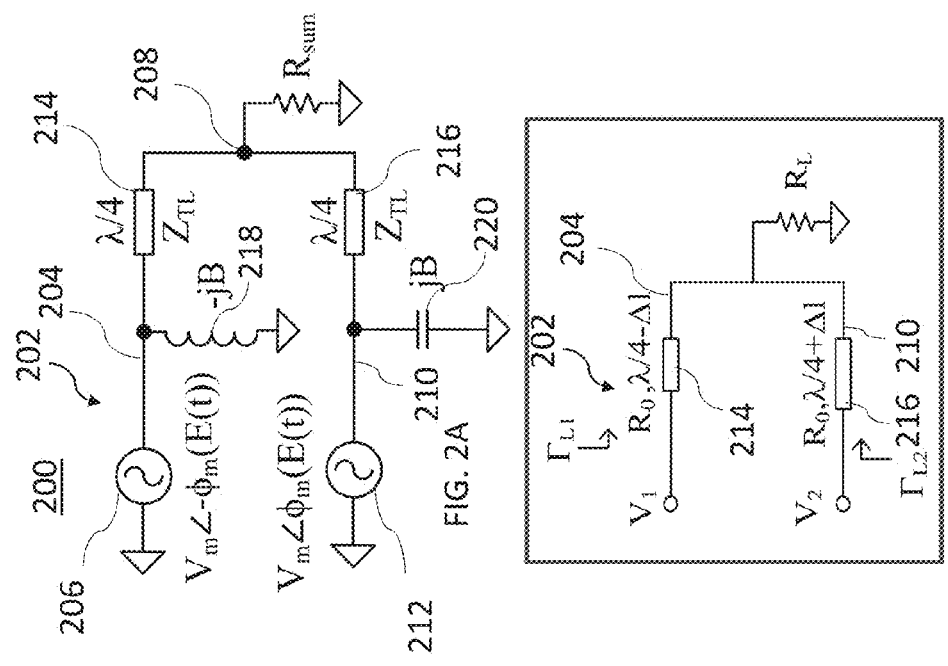
FIG. 2, which includes

Embodiments described herein include a Doherty-Chireix combined amplifier and a corresponding method of operating the Doherty-Chireix combined amplifier. The Doherty-Chireix combined amplifier can be controlled to provide the advantageous back-off characteristics of both of the Doherty and Chireix in various regions. The Doherty-Chireix combined amplifier includes first and second power amplifier devices that are configured to receive and amplify the RF signal. The Doherty-Chireix combined amplifier further includes a power combiner circuit that is connected to the first and second power amplifier devices. The power combiner circuit is configured to combine RF power from the amplified versions of the RF signals that are generated by the first and second amplifier devices. The topology of the power combiner circuit includes Chireix combiner that includes two impedance inverters and is configured to present a Chireix load modulated impedance response. The topology of the power combiner circuit additionally includes reactance compensation elements that are configured to cancel a reactance of the Chireix combiner when the Doherty-Chireix combined amplifier is operated in a Doherty amplifier mode.

The amplifier circuit can be operated into two different modes depending on the input amplitude of the RF signal. If the input amplitude of the RF signal is at or below a predefined threshold, the amplifier circuit operates in a Doherty amplifier mode in which the second amplifier device is turned off and all of the amplification is provided by the first amplifier device. When the input amplitude of the RF signal reaches or exceeds the predefined threshold, the amplifier circuit is operated in a Chireix amplifier mode. In the Chireix amplifier mode, both of the first and second amplifier devices are turned on and the power combiner circuit is used to combine the first and second amplified versions of the RF signal at a summing node. In the Chireix amplifier mode, the Doherty-Chireix combined amplifier performs an outphasing operation whereby a first amplified version of the RF signal is out of phase with a second amplified version of the RF signal, and wherein the difference in phase represents the amplitude information contained within the original RF signal. Thus, Doherty-Chireix combined amplifier operates as a Doherty amplifier at low power levels and as a Chireix amplifier at high power levels.

The embodiments described herein include a number of techniques and circuit topology adjustments that serve to enhance linearity, power efficiency, and a smooth transition between the Doherty amplifier mode and the Chireix amplifier with respect to amplifier output power. A first exemplary technique involves the inclusion of reactance compensation elements in the power combiner circuit. These reactance compensation elements compensate for a reduction in efficiency of the amplifier in the Doherty amplifier which is attributable to the reactance of the Chireix combiner. A second exemplary technique involves the adjustment to the amplitude values of the first and second amplified signals during the Chireix amplifier mode. This technique compensates for a detrimental shift in the impedance of the Chireix combiner due to the presence of the reactance compensation elements in the power combiner circuit thereby improving efficiency in the Chireix amplifier mode. A third exemplary technique involves turn-on control of the second amplifier as the amplifier circuit transitions from Doherty amplifier mode to Chireix amplifier mode. By controlling the time at which the second amplifier circuit turns on and the rate at which the second amplifier circuit turns on, relative to an input amplitude of the RF signal, the linearity and power efficiency of the circuit can be improved and a smoother transition between the Doherty and Chireix amplifier modes can be realized.

Referring to FIG. 1A, a Doherty amplifier 100 is depicted, according to an embodiment. The Doherty amplifier 100 is configured to amplify an RF signal (e.g., an amplitude modulated (AM) signal) using at least one of two amplifier devices. The two amplifier devices can be provided by any type of RF transistor device, including a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc.

The Doherty amplifier 100 includes a Doherty combiner 102 connected to first and second amplifiers 104, 106. The Doherty combiner 102 includes a first branch 108 connected between the first amplifier 104 and a summing node 110, and a second branch 112 connected between the second amplifier 106 and the summing node 110. An impedance inverter 114, and more particularly a quarter wave transmission line, is connected in series with the first branch 108. The Doherty amplifier 100 may include additional circuitry (not shown), including input control circuitry, input impedance matching networks, output impedance matching networks, etc. The first and second amplifiers 104, 106 can be provided together or separately in a discrete packaged device. Some or all of the additional circuit components, including the Doherty combiner 102, may be provided by inductive bond wires and chip capacitors can be incorporated into the package. Alternatively, some or all of these components may be external to the device package, e.g., at the circuit board level using microstrip lines in combination with surface mountable components.

The Doherty amplifier 100 of FIG. 1A operates in two different modes. In a low power mode, only the first amplifier 104 is active and the second amplifier 106 is turned off. In a high power mode, the second amplifier 106 turns on. The output power of the RF signals generated by the first and second amplifiers 104, 106 is combined by the Doherty combiner 102. The transition from low power mode to high power mode may be based upon the input amplitude of the RF signal. For example, the Doherty amplifier 100 transitions to the high power mode when the input RF signal reaches 50% of the maximum signal amplitude.

Referring to FIG. 1B, a smith chart of a nominal impedance response for the Doherty combiner 102 is depicted. The smith chart plots the impedance of the Doherty combiner 102 that is presented to the first and second amplifiers 104, 106 across a load modulation. The load modulation ranges from high power on the left to low power on the right. As can be seen, the Doherty combiner 102 nominally acts as a resistor across the entire power back-off. That is, there are no reactive components to the nominal impedance response for the Doherty combiner 102 at power back-off.

Referring to FIG. 2A, a Chireix amplifier 200 is depicted, according to an embodiment. The Chireix amplifier 200 is configured to amplify an RF signal (e.g., an amplitude modulated (AM) signal) using two amplifier devices. The two amplifier devices can include any type of RF transistor device, including a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc.

The Chireix amplifier 200 includes a Chireix combiner 202 connected to the amplifiers. The Chireix combiner 202 includes a first branch 204 connected between a first amplifier 206 and a summing node 208, and a second branch 210 connected between a second amplifier 212 and the summing node 208. The first branch 204 includes a first impedance inverter 214 connected in series between the first amplifier 206 and the summing node 208. The second branch 210 includes a second impedance inverter 216 connected in series between the second amplifier 212 and the summing node 208. In the embodiment of FIG. 2A, the first and second impedance inverters 214, 216 are quarter wave transmission lines that are configured to provide impedance inversion at a center frequency of the RF signal. Instead of quarter wave transmission lines, equivalent impedance transformation may be provided by inductors and capacitors, for example.

The Chireix combiner 202 further includes a first reactive efficiency compensation component 218 arranged in a shunt configuration with respect to the first branch 204, and a second reactive efficiency compensation component 220 arranged in a shunt configuration with respect to the second branch 210. In the embodiment of FIG. 1, the first reactive efficiency compensation component 218 is an inductor and the second reactive efficiency compensation component 220 is a capacitor. Alternative components providing equivalent reactance may be used instead.

FIG. 2B depicts an alternate embodiment of the Chireix combiner 202. In this embodiment, the first and second reactive efficiency components 218, 220 have been eliminated from the circuit. An equivalent reactance of the first and second reactive efficiency compensation components 218, 220 has been incorporated into the first and second impedance inverters 214, 216. In this embodiment, the first and second impedance inverters 214, 216 have asymmetrical lengths, and deviate from the quarter wavelength of a center frequency of the RF signal by an amount that produces the reactance of the first and second reactive efficiency compensation components 218, 220 at the center frequency of the RF signal.

Both of the Chireix combiners 202 of FIGS. 2A and 2B are configured to produce the Chireix load modulated impedance depicted in FIG. 2C, which will be discussed in further detail below. Different configurations and circuit equivalents may be substituted for the specific embodiments described with reference to FIGS. 2A and 2B, provided that the Chireix load modulated impedance depicted in FIG. 2C is realized.

Different to the Doherty amplifier 100, the Chireix amplifier 200 operates with the first and second amplifiers 206, 212 being operated at all power back-off levels. The Chireix amplifier 200 generates a first amplified version of the RF signal using the first amplifier 206 and a second amplified version of the RF signal using the second amplifier 212. The first and second amplified versions of the RF signal are constant envelope signals. That is, the first and second amplified versions of the RF signal have the same amplitude at all times. The Chireix amplifier 200 employs an outphasing technique whereby the first and second amplified versions are phase shifted from one another. The degree of phase shift corresponds between first and second amplified versions of the RF signal corresponds to the original amplitude information of the RF signal that is fed into the input of the Chireix amplifier 200.

Referring to FIG. 2C, a smith chart of a nominal impedance response presented to the first and second amplifiers 206, 212 by the Chireix combiner 202 is depicted. The smith chart plots the impedance of the Chireix combiner 202 across varying power levels. From left to right, the high power mode impedance transitions to the low power mode impedance. As can be seen, the Chireix combiner 202 presents a load modulated impedance response across varying power levels. That is, a different impedance is presented to the first and second amplifiers 206, 212, depending upon the power level at which the Chireix amplifier 200 is operating. At high power levels, the Chireix combiner 202 is less reactive. At low power levels, the Chireix combiner 202 is more reactive. As used herein, a Chireix load modulated impedance response refers to the impedance response depicted in FIG. 2C. This impedance response is a nominal impedance response with respect to back-off efficiency of the of the Chireix amplifier 200.

Figure 3:
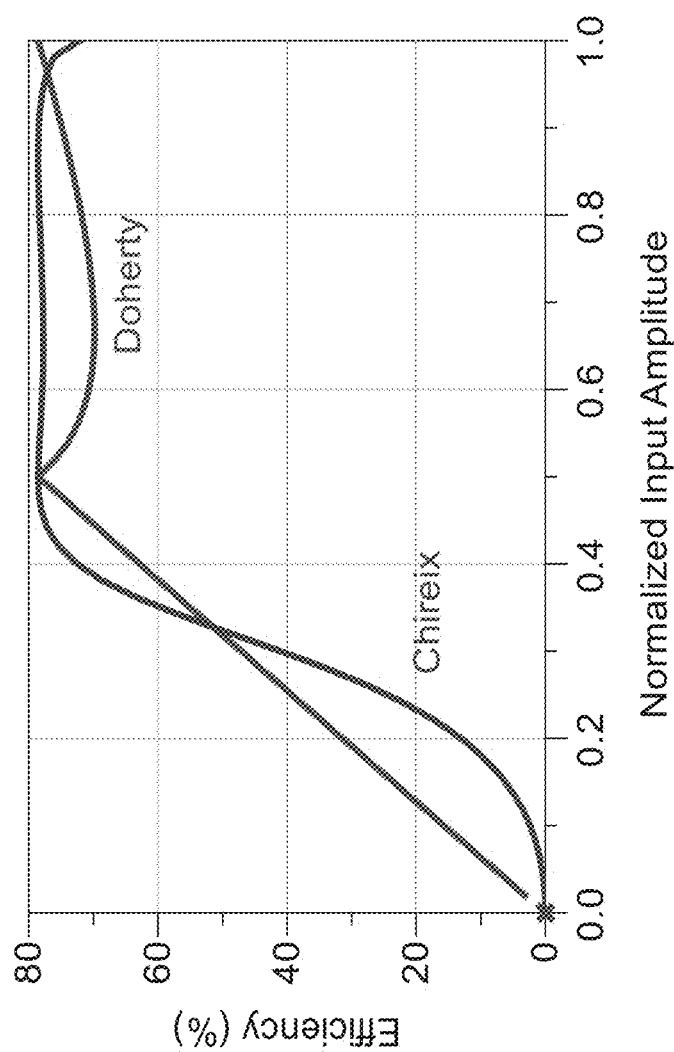
FIG. 3 illustrates an efficiency comparison of a Doherty Amplifier and a Chireix amplifier at power back-off levels, according to an embodiment.

Referring to FIG. 3, a 6 dB back-off efficiency plot for the Doherty amplifier 100 and the Chireix amplifier 200 is depicted. 6 dB back-off is used as an example. However, the circuits and techniques described herein are correspondingly applicable to other back-off efficiency optimizations. The back-off efficiency plot depicts the drain efficiency percentage of each amplifier versus the normalized input amplitude of the RF signal ranging from the minimum normalized input amplitude of 0 to the maximum normalized input amplitude of 1.0. As can be seen, each amplifier offers better back-off efficiency than the other in certain regions. The Chireix amplifier 200 provides better back-off efficiency in a high power back-off region ranging between 0.3 and 1.0 normalized input amplitude. In this region, the efficiency of the Chireix amplifier 200 approaches ideal class-B peak efficiency of 78.5% at 0.5 normalized input amplitude. Moreover, the efficiency of the Chireix amplifier 200 remains consistent at this ideal value approximately between the 0.45 normalized input amplitude and the maximum 1.0 normalized input amplitude. By contrast, the Doherty amplifier 100 contains two peak efficiency points in this high power back-off region, with one at 0.5 normalized input amplitude and the other at 1.0 normalized input amplitude. There is a notable droop in efficiency between these two values in which the efficiency of the Doherty amplifier 100 is below ideal and is less than its Chireix counterpart. However, in a lower power back-off region ranging between approximately 0.4 and 0.0 normalized input amplitude, the Doherty amplifier 100 performs better than its Chireix counterpart. As the Chireix amplifier 200 is backed off into this region, its efficiency drops rapidly. Moreover, the Chireix amplifier 200 exhibits a notable droop in efficiency around the normalized input amplitude of 0.2. By contrast, the Doherty amplifier 100 exhibits a less dramatic efficiency during back-off into the lower back-off with no drooping. Around approximately the normalized input amplitude of 0.3, the Doherty amplifier 100 becomes more efficiency than the Chireix amplifier 200.

Figure 4:
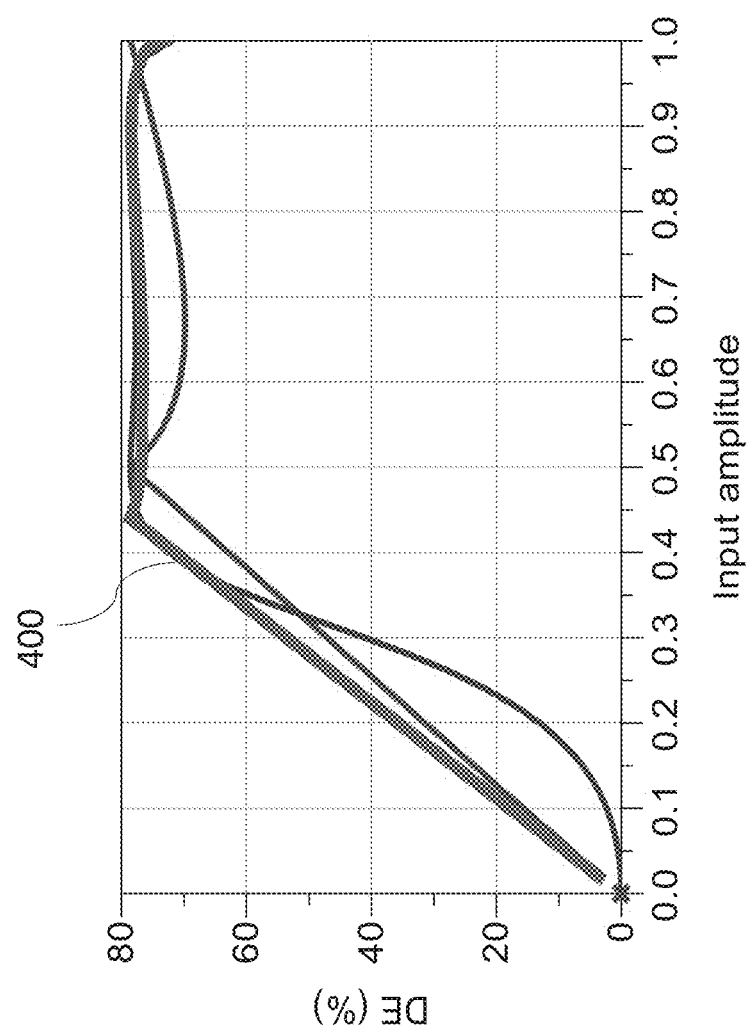
FIG. 4 illustrates an efficiency comparison of a Doherty Amplifier, a Chireix and a combined Doherty-Chireix amplifier at power back-off levels, according to an embodiment.

Referring to FIG. 4, a back-off efficiency plot 400 for a Doherty-Chireix combined amplifier is depicted. The back-off efficiency plot 400 for the Doherty-Chireix combined amplifier is achieved by using a circuit topology according to the device embodiments to be described below and by operating this circuit topology according to the method embodiments to be described below. The efficiency plots of the Doherty amplifier 100 and the Chireix amplifier 200 as described with reference to FIG. 3 are provided for sake of comparison. As can be seen, the Doherty-Chireix combined amplifier provides the beneficial aspects of each amplifier with respect to back-off efficiency. That is, in the high power back-off region ranging approximately between 0.45 and 1.0 normalized input amplitude, the Doherty-Chireix combined amplifier provides comparable performance as the Chireix amplifier 200. In the low power region ranging between 0.45 and 0 normalized input amplitude, the Doherty-Chireix combined amplifier provides comparable (and in fact slightly better) performance as the Doherty amplifier 100. Overall, the Doherty-Chireix combined amplifier performs equal to or better than its Doherty and Chireix counterparts across virtually all of the power back-off range and thus offers improved back-off efficiency than the Doherty amplifier 100 described with reference to FIG. 1 or the Chireix amplifier 200 described with reference to FIG. 2. Moreover the Doherty-Chireix combined amplifier provides a smooth transition between the low power region and the high power region.

Referring to FIG. 5, a Doherty-Chireix combined amplifier 500 is depicted. The Doherty-Chireix combined amplifier 500 includes first and second amplifier devices 502, 504 that are each configured to amplify an RF signal, such as an AM signal. The first and second amplifier devices 502, 504 can include any type of RF transistor device, including a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc. The Doherty-Chireix combined amplifier 500 further includes a power combiner 506. The power combiner 506 is configured to combine the RF power of the amplified RF signals generated by the first and second amplifier devices 502, 504 at a summing node 508.

The Doherty-Chireix combined amplifier 500 is configured to operate in two modes dependent upon an amplitude value of the RF signal that is received by the first and second amplifier devices 502, 504. When the amplitude of the received RF signal is at or below a predefined threshold, the Doherty-Chireix combined amplifier 500 operates in a Doherty amplifier mode. In the Doherty amplifier mode, the RF signal is amplified using the first amplifier device 502 while the second amplifier device 504 is turned off. The Doherty-Chireix combined amplifier 500 operates in a Chireix amplifier mode when the received RF signal is above the predefined threshold. In the Chireix amplifier mode, the Doherty-Chireix combined amplifier 500 uses the first and second amplifier devices 502, 504 to amplify the RF signal and performs the outphasing operation of the Chireix amplifier 200 as described with reference to FIG. 2.

Referring to FIG. 6, a performance analysis of the Doherty-Chireix combined amplifier 500 is depicted. In this embodiment, the power combiner 506 is identical to the Chireix combiner 202 described with reference to FIG. 2. The Doherty-Chireix combined amplifier 500 is operated in the Doherty amplifier mode for input amplitude values between 0 and 0.5 normalized input amplitude of the RF signal and is operated in the Chireix amplifier mode for input amplitude values between 0.5 and 1.0 normalized input amplitude of the RF signal. FIG. 6A depicts an equivalent circuit for the Doherty-Chireix combined amplifier 500 in the Doherty amplifier mode, i.e., with the first amplifier device 502 activated and the second amplifier device 504 turned off. FIG. 6B depicts a Smith chart for the impedance of the power combiner 506 presented to the amplifier 502 in the two modes of operation. FIG. 6C depicts a back-off efficiency plot that shows drain efficiency vs. input amplitude in a similar manner as the plots described with reference to FIG. 3 and FIG. 4.

As can be seen in FIG. 6C, in a high-power back-off region ranging between 0.55 and 1.0 normalized input amplitude, the Doherty-Chireix combined amplifier 500 provides corresponding performance as the Chireix amplifier 200. This is to be expected, as the Doherty-Chireix combined amplifier 500 is configured identically and is being operated in an identical manner as the Chireix amplifier 200 described with reference to FIG. 2. However, in a low-power back-off region ranging between 0.55 and 0.0 normalized input amplitude, several drawbacks are observed. These drawbacks relate to the fact that the power combiner 506 is presents a nominal Chireix load modulated impedance response as depicted in FIG. 2. This impedance response is considered nominal for a Chireix amplifier, but is not a nominal impedance response for the Doherty combiner 102 with respect to amplifier efficiency. The reactive losses of the power combiner 506 negatively impact the amplifier efficiency. One notable drawback is an abrupt efficiency transition between the Doherty and Chireix modes. As shown in FIG. 6C, there is a steep rate of change in efficiency between normalized input amplitudes of 0.50 and 0.55. This corresponds to the operation region in which the second amplifier device 504 is turned on. Another notable drawback is reduced efficiency in the region that ranges between normalized input amplitudes of 0.50 and 0.0. Referring again FIGS. 3 and 4, it can be seen the Doherty amplifier 100 exhibits a near linear increase in efficiency between normalized input amplitudes of 0.0 and 0.5, and reaches a maximum efficiency of approximately 78.5%. By way of comparison, the efficiency plot of FIG. 6C shows that Doherty-Chireix combined amplifier 500 reaches a maximum efficiency of approximately 60% for normalized input amplitude of 0.5. Techniques for addressing these drawbacks will now be described.

Figure 7:
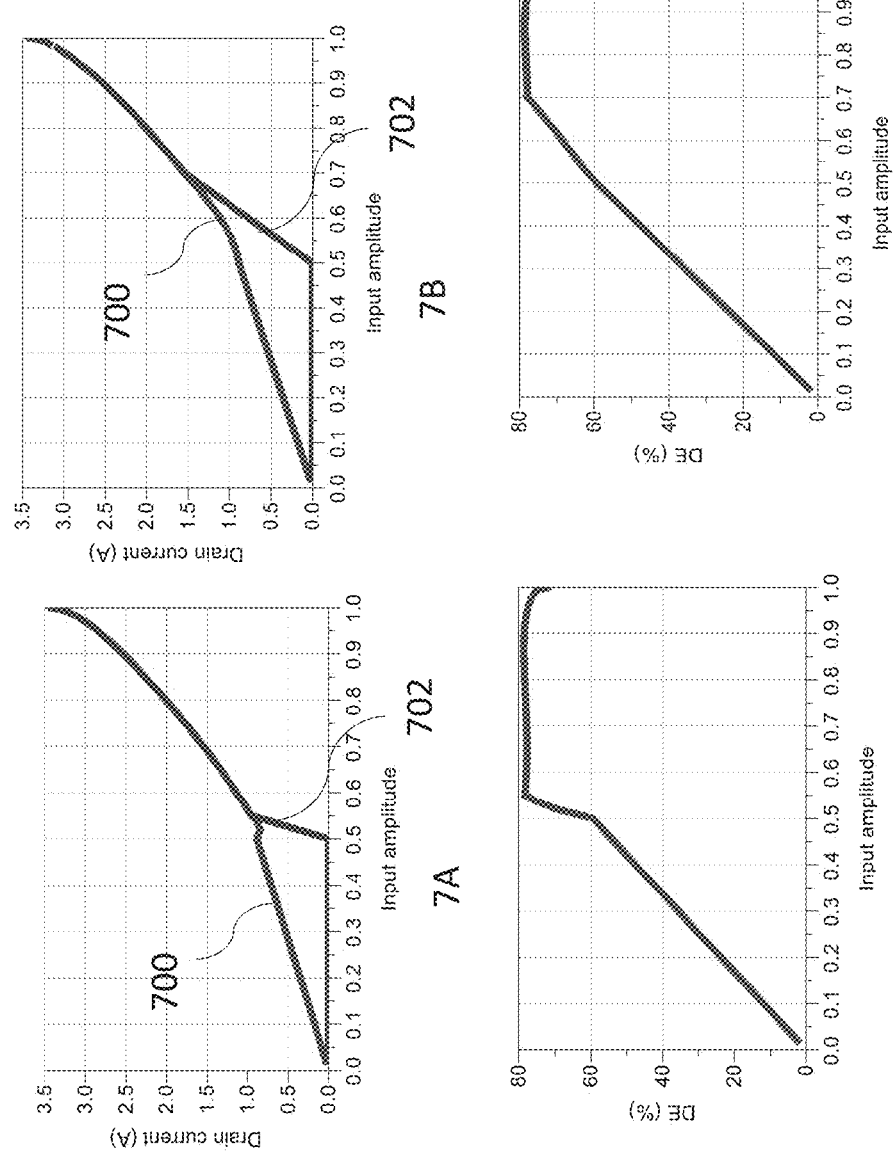
FIG. 7, which includes

Referring to FIG. 7, the impact on amplifier switching control and transition between the Doherty amplifier mode and the Chireix amplifier mode is depicted. FIGS. 7A and 7B plot the respective drain currents 700, 702 of the first and second amplifiers 502, 504 as a function of input amplifier amplitude. FIG. 7C depicts drain efficiency for the Doherty-Chireix combined amplifier 500 being operated as depicted in FIG. 7A. FIG. 7D depicts drain efficiency for the Doherty-Chireix combined amplifier 500 being operated as depicted in FIG. 7B. The transition between the Doherty amplifier mode and the Chireix amplifier mode (i.e., when the second amplifier device 504 begins to turn on) occurs at a normalized input amplitude of 0.5 for the RF input signal. As depicted in both FIGS. 7A and 7B, at this point, the drain current of the second amplifier device begins to rise. In the embodiment of FIG. 7A, the second amplifier device 504 is rapidly transitioned such that the drain current matches that of the first amplifier device 502 at approximately normalized input amplitude of 0.55. As a result, an abrupt transition in drain efficiency occurs at the transition between the Doherty and Chireix amplifier modes. By contrast, in the embodiment of FIG. 7B, the second amplifier device 504 is slowly transitioned such that the drain current of the second amplifier does not match that of the first amplifier until normalized input amplitude of approximately 0.70. As a result, the abrupt transition in drain efficiency between the Doherty and Chireix amplifier modes is eliminated. Thus, by controlling a turn-on time of the second amplifier device 504, a smooth efficiency curve for the Doherty-Chireix combined amplifier 500 is realized. The gain of the second amplifier device 504 can be controlled in the depicted manner using a variety of techniques, including controlling the gate voltage to the second amplifier devices 504. Alternatively, the device parameters of the second amplifier devices 504 can be adjusted for proper gain Referring to FIG. 8, a performance analysis of a Doherty-Chireix combined amplifier 500 with a modified power combiner 506 is depicted. FIGS. 8A and 8B depict an equivalent circuit for the Doherty-Chireix combined amplifier 500 in the Doherty amplifier mode, i.e., with the first amplifier device 502 activated and the second amplifier device 504 turned off. FIG. 8C depicts a Smith chart for the impedance presented to the first and second amplifier devices 502, 504 by the modified power combiner 506 in the two modes of operation. FIG. 8D depicts a back-off efficiency plot that shows drain efficiency vs. input amplitude.

The modified power combiner 506 includes the Chireix combiner 202 described with reference to FIG. 2A. In the embodiment of FIG. 8A, the Chireix combiner 202 corresponds to the Chireix combiner 202 described with reference to FIG. 2A, which includes the first and second reactive efficiency compensation components 218, 220. In the embodiment of FIG. 8B, the Chireix combiner 202 corresponds to the Chireix combiner 202 described with reference to FIG. 2B, which incorporates the reactance of the first and second reactive efficiency compensation components 218, 220 into the first and second impedance inverters 214, 216. Both of the modified power combiners 506 include, in addition to the Chireix combiner 202, reactance compensation elements. In particular, the modified power combiners 506 include a first reactance compensation element 800 that is arranged in a shunt configuration with respect to the first branch 204 of the Chireix combiner 202 and a second reactance compensation element 802 that is arranged in a shunt configuration with respect to the second branch of the Chireix combiner 202. The first and second reactance compensation elements 800, 802 may be any reactive component, including inductors and capacitors depending on which branch is driven, for example.

The input admittance $Y_L$ of the Chireix combiner 202 is expressed according to the following equation 1:

$$Y_L = -jB + \frac{1}{R_0^2/R_L - jX}; \quad \text{Equation 1}$$

wherein $R_0$=characteristic impedance of the first and second impedance transformers 214, 216, $R_L$=the resistance of the summing node resistor $R_{SUM}$, and B is the electrical susceptance of the Chireix efficiency compensation elements. The efficiency η of the Chireix combiner 202 is expressed according to the following equation 2:

$$\eta = \frac{\mathcal{R}(Y_L)}{|Y_L|}; \quad \text{Equation 2}$$

wherein $Y_L$=input admittance.

The input admittance $Y_L$ of the Chireix combiner 202 is contains an imaginary component, due to the reactance of the first and second reactive efficiency compensation components 218, 220 (FIG. 8A) or the first and second impedance inverters 214, 216 that are configured as different length transmission lines (FIG. 8B). Using an example to solve for Equation (1), assuming 6 dB back-off, a 20 Ohm summing node impedance ($R_L$), and an 8 Ohm peak power impedance (Rp), the characteristic impedance $R_0$ is 17.9 Ohm. This means that the combiner efficiency is only 75.593% as calculated according to Equation (2). Assuming ideal class-B operation, which has 78.5% peak efficiency, the achievable efficiency is therefore only 59.37% which is 19.1% lower than ideal class-B operation. In other words, the reactance of the Chireix combiner 202 decreases efficiency of the Chireix combiner 202 in comparison to a purely resistive power combiner.

The first and second reactance compensation elements 800, 802 are configured to compensate for the reactance of the Chireix combiner 202 in the Doherty amplifier mode. In other words, the first and second reactance compensation elements 800, 802 collectively shift the impedance presented by the modified power combiner 506 closer to the ideal Doherty combiner response depicted in FIG. 1A. This is done by selecting parameter values of the first and second reactance compensation elements 800, 802 that cancel the reactance of the first and second efficiency reactive components (in the case or FIG. 8A) or the first and second different length transmission lines (in the case or FIG. 8A). These parameter values can be selected to completely cancel the reactance of the Chireix combiner 202 such that, at a center frequency of the RF signal, the modified power combiner 506 is purely resistive. A cubic equation can be derived to find a solution which makes the imaginary part of the admittance to be zero. Alternatively, optimization using computer-aided-design (CAD) system can be effectively used.

FIGS. 8C and 8D illustrate the effects of compensating for the reactance of the Chireix combiner 202 using the first and second reactance compensation elements 800, 802. As can be seen from a comparison of FIG. 8C to FIG. 6B, the impedance of the modified power combiner 506 in the Doherty amplifier region (right side of Smith chart) is shifted towards the real axis. As can be seen from a comparison of FIG. 8D to FIG. 6C, a marked improvement in efficiency is realized for the low power back-off region ranging between 0.50 and 0.0 normalized input amplitude. In this region, the amplifier exhibits a linear increase in efficiency and reaches an ideal class-B efficiency of 78.5%. Thus, by the inclusion of the first and second reactance compensation elements 800, 802 in the modified power combiner 506, the Doherty-Chireix combined amplifier 500 can realize an efficiency corresponding to that of the Doherty amplifier 100 at low power back-off levels.

However, FIGS. 8C and 8D also reveal that, in the absence of any other adjustments, the first and second reactance compensation elements 800, 802 detrimentally impact the performance of the Doherty-Chireix combined amplifier 500 in the Chireix amplifier mode. As can be seen in FIG. 8D, the Doherty-Chireix combined amplifier 500 has a reduced efficiency in a range between 0.70 and 1.0 normalized input amplitude. This reduction is caused by the incorporation of the first and second reactance compensation elements 800, 802 into the modified power combiner circuit 506.

As can be seen from a comparison of FIG. 8C to FIG. 6B, the impedance of the modified power combiner 506 in the Chireix amplifier region (left side of Smith chart) is shifted upward towards the inductance axis. This reveals that the impedance presented by the modified power combiner 506 shifts away from the nominal Chireix load modulated impedance response towards a more inductive impedance response. A method of compensating for the impact of the first and second reactance compensation elements 800, 802 in the Chireix amplifier mode will now be discussed with reference to FIG. 9.

Figure 9:
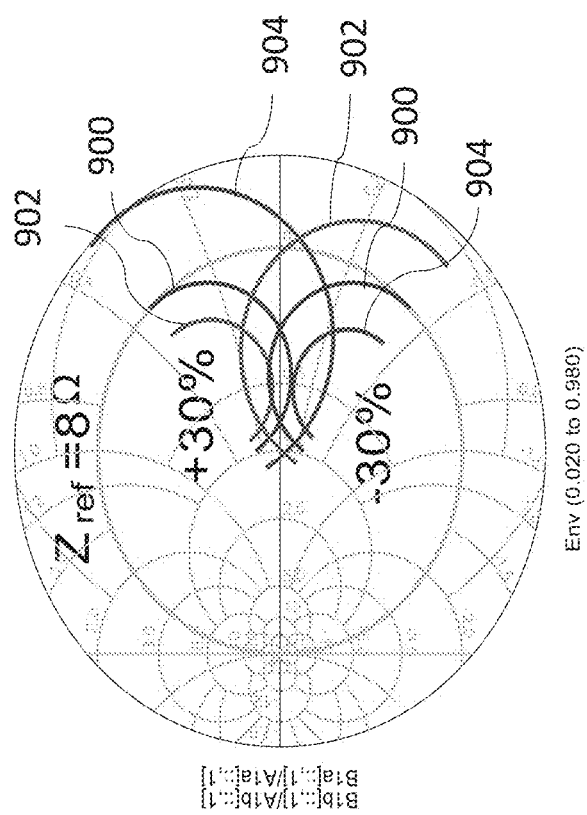
FIG. 9 depicts the effect of asymmetric outphasing on the load modulated impedance response of a power combiner circuit, according to an embodiment.

Referring to FIG. 9, a smith chart is provided that depicts the effect of signal amplitude variation on the impedance response of the power combiner 506. The smith chart includes three different load modulated impedance response curves. A first load modulated impedance response curve 900 shows a load modulated impedance response for the Chireix combiner 202 with the first and second amplified RF signals being equal in amplitude. This corresponds to the nominal Chireix load modulated impedance response described with reference to FIG. 2A. A second load modulated impedance response curve 902 shows an upward (i.e., more inductive) adjusted load modulated impedance response that corresponds to a case in which the amplitude of the first amplified RF signal (which is generated by the first amplifier device 502) is increased thirty percent relative to the amplitude of the second amplified RF signal (which is generated by the second amplifier device 504). A third load modulated impedance response curve 904 shows a downward (i.e., more capacitive) adjusted load modulated impedance response that corresponds to a case in which the amplitude of the first amplified RF signal is decreased thirty percent relative to the amplitude of the second amplified RF signal. As can be seen, by appropriately setting a difference in the amplitude of the first and second amplified RF signals, the load modulated impedance response can be shifted in a desired direction. This principle is used in an embodiment of the Doherty-Chireix combined amplifier 500 to compensate for the impact of the first and second reactance compensation elements 800, 802 on the nominal Chireix load modulated impedance response as described above.

Referring to FIG. 10, a performance analysis of a Doherty-Chireix combined amplifier 500 is depicted, according to an embodiment. In this case, the Doherty-Chireix combined amplifier 500 includes the modified power combiner 506 that is configured to cancel a reactance of the Chireix combiner 202 as described with reference to FIG. 8. In addition, an asymmetric amplitude adjustment to compensate for the reactance of the first and second reactance compensation elements 800, 802 as described with reference to FIG. 9 is applied.

FIG. 10A depicts a Smith chart for the impedance presented to the first and second amplifier devices 502, 504 by the modified power combiner 506 in the two modes of operation. As can be seen, the modulated impedance presented to the first and second amplifier device 502, 504 has been adjusted to closely resemble the nominal Chireix load modulated impedance response due to the asymmetric outphasing amplitude adjustment.

FIG. 10AB depicts a back-off efficiency plot that shows drain efficiency vs. input amplitude. As can be seen, the efficiency of the Doherty-Chireix combined amplifier 500 a range between 0.70 and 1.0 normalized input amplitude corresponding to the Chireix amplifier mode closely resembles that of the Chireix amplifier 200 in a corresponding back-off region.

Referring to FIG. 11, the effects of adjustment to the turn-on time of the second amplifier device 504 is depicted. In this case, the Doherty-Chireix combined amplifier 500 includes the modified power combiner 506 and is operated using the asymmetric amplitude adjustment as previously described. FIG. 11A depicts a back-off efficiency plot that shows drain efficiency vs. input amplitude for various transition points between the Doherty and Chireix modes, i.e., the point at which the second amplifier device 504 turns on. A first plot 900 depicts efficiency for a transition between the Doherty and Chireix amplifier modes at 0.5 maximum input amplitude of the RF signal. A second plot 902 depicts efficiency for a transition between the Doherty and Chireix modes at 0.44 maximum input amplitude of the RF signal. A third plot 904 depicts efficiency for a transition between the Doherty and Chireix modes at 0.33 maximum input amplitude of the RF signal. As can be seen, by adjusting the transition points, a favorable improvement to efficiency in the Doherty amplifier mode can be realized without detrimentally impacting operation in the Chireix mode.

FIGS. 11B and 11C depict an optimization of the back-off efficiency by combining the transition time turn on improvements described with reference to FIG. 11A and the controlled turn on of the second amplifier device 504 as described with reference to FIG. 7. In this case, the Doherty-Chireix combined amplifier 500 includes the modified power combiner 506 and is operated using the asymmetric amplitude adjustment as previously described. FIG. 11B depicts the respective drain currents 700, 702 of the first and second amplifiers 502, 504 as a function of input amplifier amplitude wherein the transition between the Doherty and Chireix modes occurs at 0.44 maximum amplitude of the RF signal. FIG. 11C depicts a resulting efficiency curve 400 that corresponds to the efficiency curve 400 described with reference to FIG. 4. Advantageously, the circuits and methods described herein produce high efficiency in all back-off regions and with a smooth transition between the single amplifier mode (i.e., the Doherty amplifier mode) and the dual amplifier mode (i.e., the Chireix amplifier mode).

Figure 12:
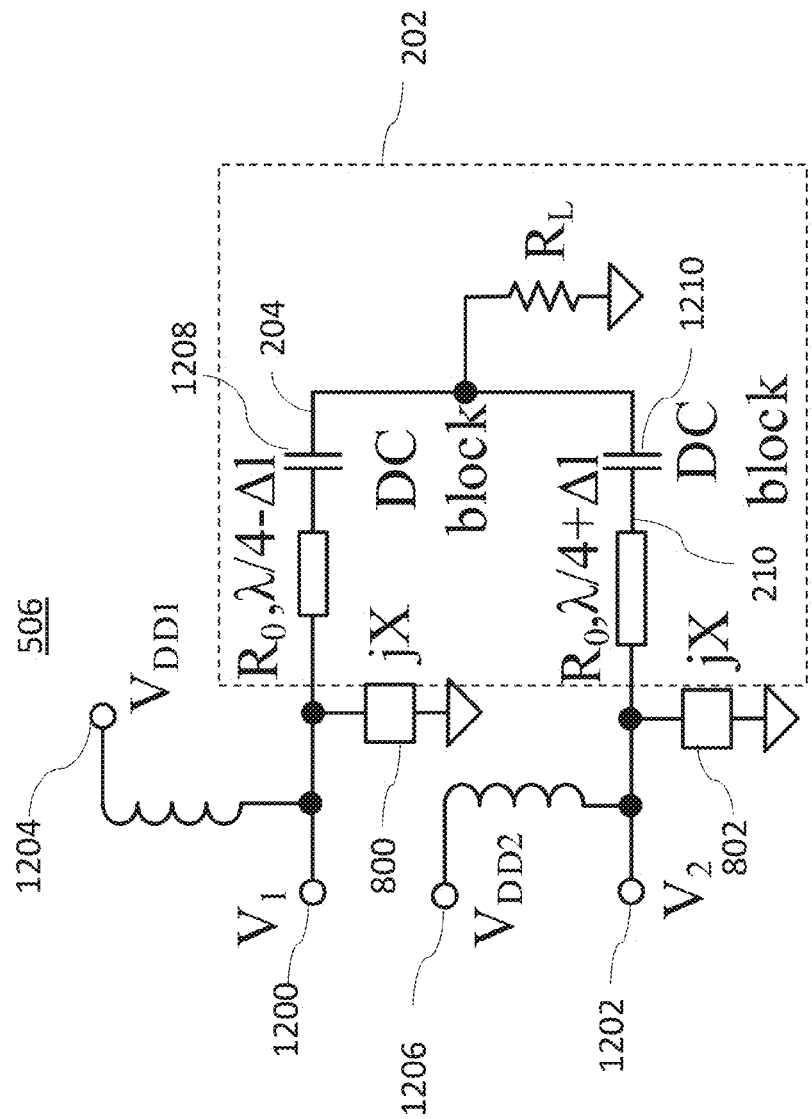
FIG. 12 illustrates a power combiner circuit for a Doherty-Chireix amplifier, according to an embodiment.

Referring to FIG. 12, a power combiner 506 is depicted, according to an embodiment. The power combiner includes first and second RF input ports 1200, 1202 that connect to the first and second amplifier devices 502, 504 of the Doherty-Chireix combined amplifier 500. The power combiner 506 includes the Chireix combiner 202 described with reference to FIG. 2. The Chireix combiner 202 is configured to present the Chireix load modulated impedance response to the first and second RF input ports 1200, 1202. In addition, the power combiner 506 includes the first and second reactance compensation elements 800, 802 as described with reference to FIG. 8. The first and second reactance compensation elements 800, 802 at least partially compensate for the reactance of the Chireix combiner 202 in the Doherty amplifier mode and, as previously explained, may be configured to completely cancel out a reactance of the Doherty-Chireix combined amplifier 500 such that the impedance seen at the first and second RF input ports 1200, 1202 when an RF signal is applied to the first RF input port 1200 and the second RF input port 1202 is electrically open.

In addition, the power combiner 506 includes DC taps 1204, 1206 connected to the first and second branches. The DC taps 1204, 1206 enable the amplitude adjustment to the first and second amplified RF signals as described with reference to FIGS. 9 and 10 when the Doherty-Chireix combined amplifier 500 is operated in the Chireix amplifier mode. First and second DC blocking capacitors 1208, 1210 are connected in series with the first and second branches 204, 210 of the power combiner 506. The first and second DC blocking capacitors 1208, 1210 remove the DC component of the amplitude adjustments provided by the DC taps 1204, 1206. Alternatively, instead of the DC taps 1204, 1206 and the DC blocking capacitors 1208, 1210, the amplitude adjustment to the first and second amplified RF signals as described with reference to FIGS. 9 and 10 can be achieved according to a variety of other techniques. For example, the parameters of the first and second amplifier devices 502, 504 can be adjusted for asymmetric operation. As another example, the control signals applied to the first and second amplifier devices 502, 504 can be configured for asymmetric operation.

Figure 13:
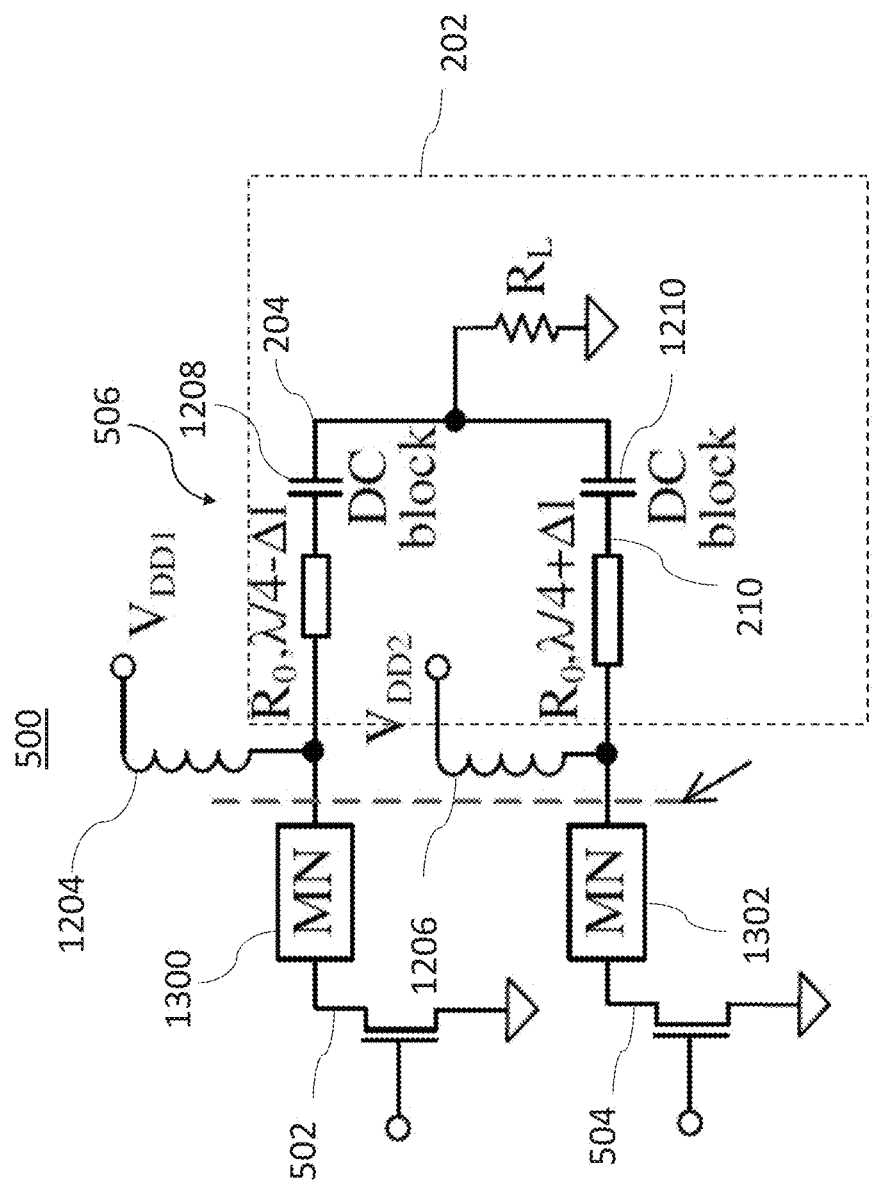
FIG. 13 illustrates a combined Doherty-Chireix amplifier, according to an embodiment.

Referring to FIG. 13, a Doherty-Chireix combined amplifier 500 is depicted, according to an embodiment. In this embodiment, the Doherty-Chireix combined amplifier 500 includes a power combiner 506 that is identical to the power combiner 506 described with reference to FIG. 12, except that the first and second reactance compensation elements 800, 802 are omitted from the power combiner 506. The Doherty-Chireix combined amplifier 500 further includes first and second amplifier devices 502, 504 which are embodied as MOSFETs. The Doherty-Chireix combined amplifier 500 further includes a first output matching network 1300 connected between the first amplifier device 502 and the first branch 204 of the power combiner 506 and a second output matching network 1302 connected between the second amplifier device 504 and the second branch 210 of the of the power combiner 506. The first and second output matching networks 1300, 1302 are part of an integrated output impedance matching that is configured to match an output impedance of the first and second amplifier devices 502, 504 with a fixed value. The first and second output matching networks 1300, 1302 may be provided from chip capacitors and inductive bond wires that are incorporated into a device package that includes the first and second amplifier devices 502, 504. In this embodiment, the reactance of the first and second reactance compensation elements 800, 802 has been incorporated into the first and second output matching networks 1300, 1302. That is, the first and second output matching networks 1300, 1302 are configured to, in addition to impedance matching, compensate for the reactance of the Chireix combiner 202 in the Doherty amplifier mode in the manner previously described.

Terms such as "same," "match" and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" describes a permanent low-ohmic connection between electrically connected elements, for example a wire connection between the concerned elements. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An amplifier that is configured to amplify an RF signal, the amplifier circuit comprising:
   a power combiner circuit, comprising:
   a Chireix combiner comprising a first branch connected between a first RF input port and a summing node and a second branch connected between a second RF input port and the summing node, each of the first and second branches comprising an impedance inverter, wherein the Chireix combiner is configured to present a Chireix load modulated impedance response to the first and second RF input ports; and
   compensation elements being configured to at least partially compensate for a reactance of the Chireix combiner circuit in a Doherty amplifier mode in which a signal is applied to the first RF input port and the second RF input port is electrically open.

2. The amplifier of claim 1, wherein the compensation elements comprise:
   a first reactance compensation element arranged in a shunt configuration with respect to the first branch; and
   a second reactance compensation element arranged in a shunt configuration with respect to the second branch.

3. The amplifier of claim 1, wherein the compensation elements are configured, for a center frequency of the RF signal, to completely cancel a reactance of the Chireix combiner such that the power combiner circuit has a purely resistive impedance in the Doherty amplifier mode.

4. The amplifier of claim 1, wherein the impedance inverters of the first and second branches are provided by a first transmission line connected in series with the first branch and a second transmission line connected in series with the second branch.

5. The amplifier of claim 4, wherein the first and second transmission lines have an equal length that corresponds to a quarter wavelength of a center frequency of the RF signal, wherein the Chireix combiner circuit further comprises first and second reactive efficiency compensation components that are arranged in a shunt configuration with respect to the first and second branches, respectively, and wherein the compensation elements are configured to completely cancel a reactance of the first and second transmission lines and the first and second reactive efficiency components at the center frequency of the RF signal in the Doherty amplifier mode.

6. The amplifier of claim 4, wherein the first and second transmission lines have lengths that differ from one another and from a quarter wavelength of a center frequency of the RF signal, wherein the first and second transmission lines collectively present the Chireix load modulated impedance response, and wherein the compensation elements are configured to completely cancel a reactance of the first and second transmission lines at the center frequency of the RF signal.

7. The amplifier of claim 1, further comprising:
   a first amplifier that is configured to amplify the RF signal connected to the first input port of the power combiner circuit;
   a second amplifier that is configured to amplify the RF signal connected to the second input port of the power combiner circuit;
   wherein the amplifier is configured to operate in a Doherty amplifier mode or in a Chireix amplifier mode dependent upon an amplitude value of the RF signal,
   wherein the amplifier is configured in the Doherty amplifier mode to: generate a first amplified version of the RF signal using only the first amplifier, and apply the first amplified version of the RF signal to the first RF input port, and
   wherein the amplifier is configured in the Chireix amplifier mode to: generate the first amplified version of the RF signal using the first amplifier, generate a second amplified version of the RF signal that is out of phase with the first amplified version of the RF signal using the second amplifier, apply the first amplified version of the RF signal to the first RF input port, and apply the second amplified version of the RF signal to the second RF input port.

8. The amplifier of claim 7, wherein the amplifier is configured in the Chireix amplifier mode to generate the first amplified version of the RF signal with a different amplitude than the second amplified version of the RF signal.

9. A method of amplifying an RF signal, the method comprising:
   providing an amplifier circuit comprising, a first amplifier, a second amplifier, and a power combiner circuit connected to the first and second amplifiers, the power combiner circuit comprising a Chireix combiner that is configured to present a Chireix load modulated impedance response, and compensation elements;
   operating the amplifier circuit in a Doherty amplifier mode for amplitude values of the RF signal that are at or below a predefined threshold, wherein operating the amplifier circuit in the Doherty amplifier mode comprises:
   generating a first amplified version of the RF signal using the first amplifier while the second amplifier is turned off;
   applying the first amplified version of the RF signal to a first input port of the power combiner circuit; and
   compensating for a reactance of the Chireix combiner using the compensation elements;
   operating the amplifier circuit in a Chireix amplifier mode for amplitude values of the RF signal that are above the predefined threshold, wherein operating the amplifier circuit in the Chireix amplifier mode comprises:
   generating a first amplified version of the RF signal using the first amplifier;
   generating a second amplified version of the RF signal using the second amplifier, the second amplified version of the RF signal being out of phase with the first amplified version of the RF signal; and
   using the Chireix combiner to combine the first amplified version of the RF signal and the second amplified version of the RF signal and to modulate an impedance seen by the first and second amplifiers across varying power levels of the first and second amplified versions of the RF signal.

10. The method of claim 9, further comprising transitioning the amplifier circuit between from the Doherty amplifier mode to the Chireix amplifier mode when the amplitude of the RF signal reaches the predefined threshold, wherein transitioning the amplifier circuit from the Doherty amplifier mode to the Chireix amplifier mode comprises controlling a turn on operation of the second amplifier device.

11. The method of claim 10, wherein controlling the turn on operation of the second amplifier device comprises controlling a transition time of the second amplifier so as to decrease a rate of change in amplifier power between the transition from the Doherty amplifier mode to the Chireix amplifier mode.

12. The method of claim 11, wherein controlling the turn on operation of the second amplifier device comprises selecting the predefined threshold to corresponding to an input amplitude of the RF signal that provides improved efficiency in the Doherty amplifier mode.

13. The method of claim 9, wherein the compensation elements comprise a first reactance compensation element arranged in a shunt configuration with respect to the first branch, and a second reactance compensation element arranged in a shunt configuration with respect to the second branch wherein the first and second reactance compensation elements are configured to compensate for an admittance of the Chireix combiner during the Doherty amplifier mode.

14. The method of claim 13, wherein the amplifier is operated in the Doherty amplifier mode such that the power combiner circuit has a purely resistive impedance.

15. The method of claim 9, wherein operating the amplifier circuit in the Chireix amplifier mode further comprises generating the first and second amplified versions of the RF signals with asymmetric amplitudes so as to shift an impedance of power combiner circuit towards a nominal Chireix load modulated impedance response.

16. A method of amplifying an RF signal using an amplifier comprising first and second amplifier devices, and a power combiner circuit connected to the first and second amplifiers, the power combiner circuit comprising a Chireix combiner that is configured to present a Chireix load modulated impedance response, and compensation elements, the method comprising:
    operating the amplifier in a Doherty amplifier mode when an amplitude of the RF signal is at or below a predetermined threshold, wherein operating the amplifier circuit in the Doherty amplifier mode comprises:
    amplifying the RF signal using the first amplifier device while the second amplifier device is turned off;
    extracting a first amplified RF signal from the first amplifier device using the power combiner circuit; and
    compensating for an admittance of the Chireix combiner using the compensation elements so as to increase efficiency of the amplifier circuit;
    operating the amplifier in a Chireix amplifier mode when an amplitude of the RF signal is above the predetermined threshold, wherein operating the amplifier circuit in the Chireix amplifier mode comprises:
    amplifying the RF signal using the first amplifier device and the second amplifier device;
    extracting a first amplified RF signal from the first amplifier device and a second amplified RF signal from the second amplifier device using the power combiner circuit.

17. The method of claim 16, wherein compensating for the admittance of the Chireix power combiner circuit comprises using a first reactance compensation element that is connected to a first branch of the Chireix combiner and a second reactance compensation element that is connected to a second branch of the Chireix combiner, and wherein the amplifier is operated in the Doherty amplifier mode such that the power combiner circuit has a purely resistive impedance.

18. The method of claim 16, wherein the amplifier further comprises a first output matching network connected between the first amplifier device and the power combiner circuit and a second output matching network connected between the second amplifier device and the power combiner circuit, and wherein compensating for the admittance of the Chireix power combiner circuit comprises using reactances of the first and second output matching networks, and wherein the amplifier is operated in the Doherty amplifier mode such that the power combiner circuit has a purely resistive impedance.

19. The method of claim 16, wherein operating the amplifier in a Chireix amplifier mode comprises generating the first and second RF amplified signals with asymmetric amplitudes, and wherein a difference in amplitude between the first and second the first and second RF amplified signals shifts an impedance of power combiner circuit towards a nominal Chireix load modulated impedance response.

20. The method of claim 16, further comprising transitioning the amplifier circuit from the Doherty amplifier mode to the Chireix amplifier mode when the amplitude of the RF signal reaches the predefined threshold, wherein transitioning the amplifier circuit from the Doherty amplifier mode to the Chireix amplifier mode comprises controlling a turn-on time of the second amplifier and selecting an amplitude value of the predefined threshold for increased efficiency and decreased rate of change in power at power back off levels.

* * * * *